United States Patent
Kamimura

[11] Patent Number: 6,081,015
[45] Date of Patent: Jun. 27, 2000

[54] SEMICONDUCTOR DEVICE HAVING IMPROVED PROTECTIVE CIRCUITS

[75] Inventor: Shinya Kamimura, Kitakatsuragi-gun, Japan

[73] Assignee: Sharp Kabushiki Kaisha, Osaka, Japan

[21] Appl. No.: 09/276,688

[22] Filed: Mar. 26, 1999

[30] Foreign Application Priority Data

Mar. 26, 1998 [JP] Japan .................................. 10-078752

[51] Int. Cl.[7] .................................................. H01L 23/62
[52] U.S. Cl. .......................... 257/360; 257/362; 257/363
[58] Field of Search ..................................... 257/355, 356, 257/357, 358, 359, 360, 361, 362, 363

[56] References Cited

U.S. PATENT DOCUMENTS

| | | | |
|---|---|---|---|
| 3,636,385 | 1/1972 | Koepp . | |
| 5,670,799 | 9/1997 | Croft | 257/173 |
| 5,811,845 | 9/1998 | Isono et al. | 257/256 |
| 5,903,420 | 5/1999 | Ham | 361/56 |
| 5,917,220 | 6/1999 | Waggoner | 257/360 |

FOREIGN PATENT DOCUMENTS 8-116027  5/1996  Japan .

*Primary Examiner*—Ngân V. Ngô
*Attorney, Agent, or Firm*—Nixon & Vanderhye P.C.

[57] ABSTRACT

In a semiconductor device, in order to protect an interior of the device, protective circuits are provided. The protective circuits include a first circuit connected between the first terminal and a negative potential line, a second circuit connected between the first terminal and a ground potential line, and a third circuit connected between the ground potential line and a second terminal. The first circuit consists of a MOS transistor having a drain connected with the first terminal, a source connected with the negative potential line, and a gate connected with the first terminal or the negative potential line. The second circuit consists of a MOS transistor having a drain connected with the first terminal, a source connected with the ground potential line, and a gate connected with the first terminal or the ground potential line. The third circuit consists of a MOS transistor having a drain connected with the second terminal, a source connected with the ground potential line, and a gate connected with the second terminal or the ground potential line.

17 Claims, 6 Drawing Sheets

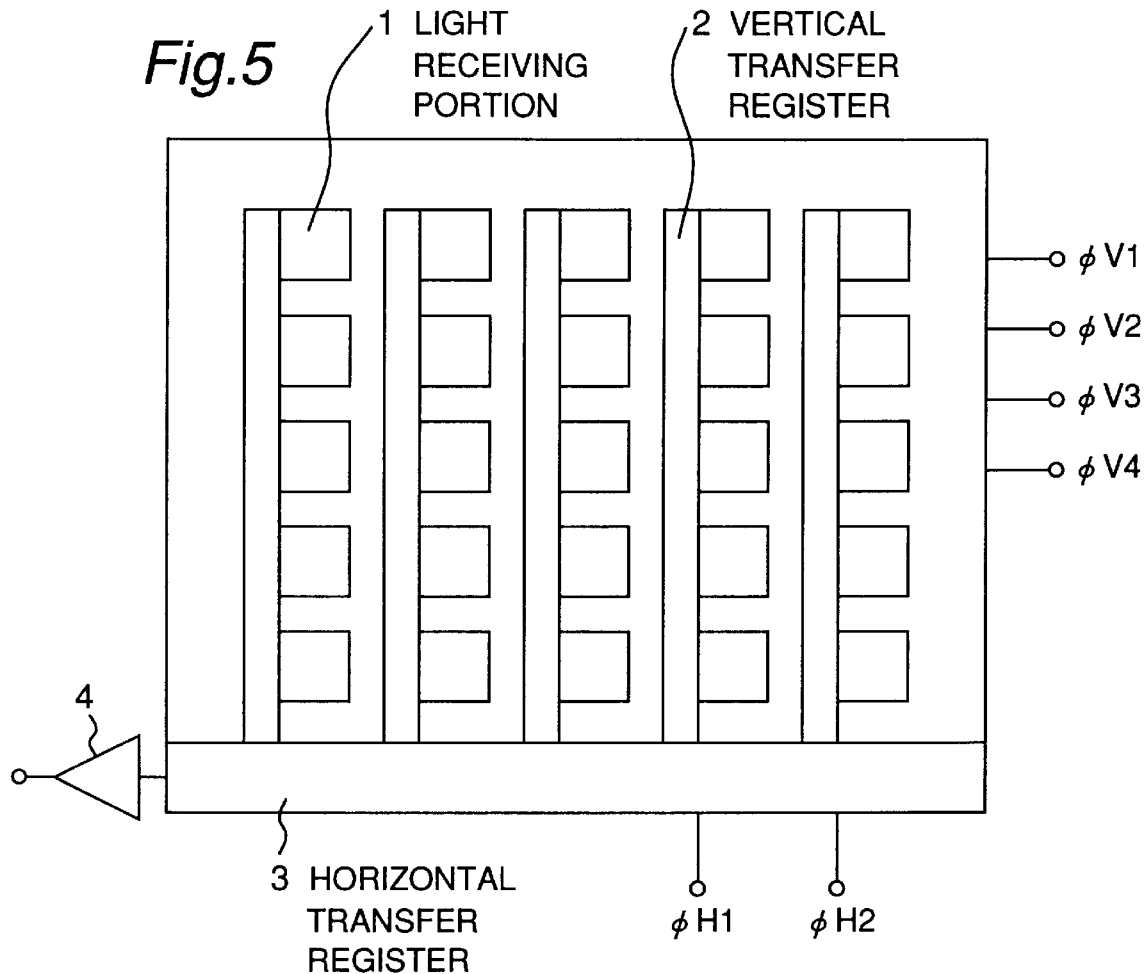
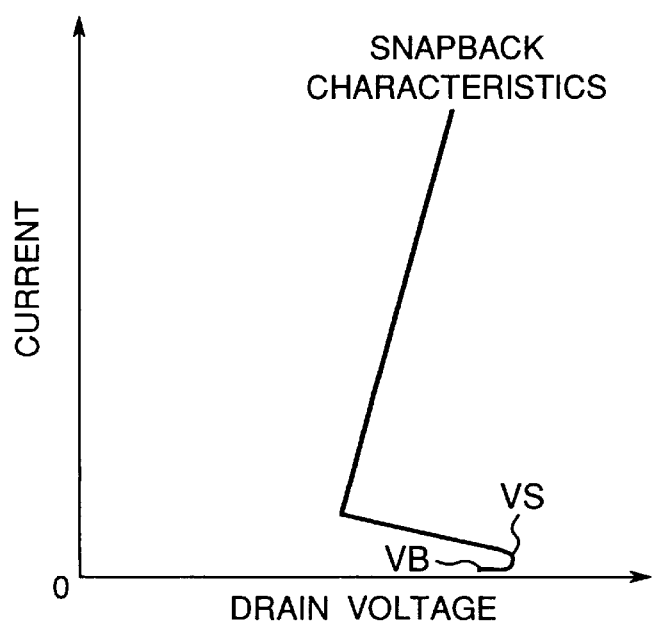

SEMICONDUCTOR DEVICE HAVING IMPROVED PROTECTIVE CIRCUITS

BACKGROUND OF THE INVENTION

The present invention generally relates to semiconductor devices, such as a CCD solid-state image sensing device, in which various types of voltages such as a ground voltage, a positive voltage, and a negative voltage are applied to each of a plurality of terminals, and more particularly, to protective circuits to be connected with terminals of such a semiconductor device.

As an example of the semiconductor device, a CCD solid-state image sensing device is schematically shown in FIG. 5. A plurality of light receiving portions 1 are arranged in a matrix form, and vertical transfer registers 2 are provided adjacently to the light-receiving portions 1 of each column. A horizontal transfer register 3 is provided at an end of each vertical transfer register 2. An output circuit 4 is connected with one end of the horizontal transfer register 3.

An electric charge of a signal photoelectrically converted at each light-receiving portion 1 is read at the vertical transfer register 2, and then transferred to the horizontal transfer register 3 through the vertical transfer register 2. The output circuit 4 converts the signal electric charge transferred thereto through the horizontal transfer register 3 into a voltage for each pixel and outputs the voltage. The vertical transfer registers 2 are four-phase driven. A ternary pulse changing from a positive voltage to a negative voltage, (the ternary pulse assumes, for example, −9 V, 0 V, and 15 V) is applied to terminals φV1 and φV3 of the vertical transfer register to allow the vertical transfer register 2 to read the signal electric charge from the corresponding light receiving portions 1. A negative voltage binary pulse assuming, for example, −9 V and 0 V is applied to terminals φV2 and φV4 of the vertical transfer register 2 not to allow the vertical transfer register 2 to read the signal electric charge. The horizontal transfer register 3 is two-phase driven. A positive voltage binary pulse assuming, for example, 0 V and 5 V is applied to terminals φH1 and φH2.

As described above, the CCD solid-state image sensing device is supplied with various types of voltages including the ground voltage (GND), positive voltages such as a supply voltage and a positive voltage to be applied to the horizontal transfer register 3, and a negative voltage to be applied to the vertical transfer registers 2.

Each of the terminals through which the voltages are applied to elements of the device is connected with a protective circuit for protecting the interior of each element of the device. For example, because a substantially greatest electric voltage is applied to vertical transfer gates of the vertical transfer register 2 through the terminals φV1 and φV3, an insulation film (gate insulation film) positioned under the vertical transfer gate electrode is easily destroyed by static electricity. Therefore, a protective circuit is connected with each of the terminals of the horizontal transfer register 3 and the vertical transfer register 2 to prevent the gate insulation film for the electric charge transfer electrode from being destroyed by the static electricity. A protective circuit is also connected with each of a power supply terminal, an output terminal, and a reset drain terminal to prevent junctions in internal elements (e.g. an output MOS transistor and a reset transistor) from being destroyed. The protective circuits are constituted of MOS transistors, bipolar transistors or diodes.

An example of a protective circuit provided in a conventional CCD solid-state imaging device is shown in FIGS. 6A and 6B which are a schematic sectional view and an equivalent circuit diagram of the device, respectively. In FIGS. 6A and 6B, a vertical transfer register and a horizontal transfer register are denoted by the same reference numbers, 2 and 3, as those used in FIG. 5. Also, in these figures, reference symbol T1 denotes a terminal of the vertical transfer register 2, reference symbol C1 denotes a gate of the vertical transfer register 2, reference symbol T2 denotes a terminal of the horizontal transfer register 3, and reference symbol C2 denotes a gate of the horizontal transfer register 3. It should be understood that the terminal T1 corresponds to the terminal φV1, φV2, φV3, or φV4 shown in FIG. 5, and that the terminal T2 corresponds to the terminal φH1 or φH2. In operation, the terminal T1 is supplied with either a ternary pulse ranging from a negative voltage to a positive voltage, such as, for example, −9 V, 0 V, and 15 V, or a negative voltage binary pulse (a transfer clock pulse) which assumes −9 V and 0 V. On the other hand, the terminal T2 is supplied with a positive voltage binary pulse (a transfer clock pulse) of, for example, 0 V and 5 V. The gates C1 and C2 are formed on a P-type well 6 to which the ground voltage is applied, so that an image sensing part 5 transfers an electric charge.

Reference symbols H11 and H12 denote protective circuits connected with the terminals T1 and T2, respectively, to protect the gates C1 and C2 and insulation films confronting the gates C1 and C2. Each of the protective circuits H11 and H12 is composed of a MOS transistor. The protection transistor H11 is constructed of a source 8 and a drain 10 both formed in a P-type well 7 formed on an N-type substrate 15, and a gate 9 that is formed over a channel provided between the source 8 and the drain 10 with a gate insulation film interposed between the gate 9 and the channel. Similarly, the protection transistor H12 is constructed of a source 11 and a drain 13 both formed in a P-type well 6 formed on the N-type substrate 15, and a gate 12 that is formed over a channel provided between the source 11 and the drain 13 with a gate insulation film interposed between the gate 12 and the channel. Because the terminal T1 is driven by a negative voltage, the protective MOS transistor H11 is required to be formed on the P-type well 7 to which a negative voltage (VL=−9 V) is applied. The source 8 and the gate 9 of the protective MOS transistor H11 are connected with a negative potential well terminal VL (=−9 V), and the drain 10 is connected with the terminal T1. On the other hand, the terminal T2 is driven by a positive voltage. Therefore, the protective MOS transistor H12 is required to be formed on the P-type well 6 in which the image sensing part 5 is formed and to which the ground voltage is applied. The source 11 and the gate 12 of the protective MOS transistor H12 are connected with the ground, and the drain 13 is connected with the terminal T2. A protective circuit is provided for other terminals to which a positive voltage is applied, for example, a supply terminal, an output terminal, and a reset drain terminal.

The operation of the protective MOS transistors H12 and H11 will be described below.

When static electricity that is positive with respect to the ground terminal G1 is applied to the terminal T2 for some reason, the positive static electricity is discharged (Ip1) from the terminal T2 to the ground terminal G1 owing to snap-back phenomenon (described later) in the protective MOS transistor H12. Therefore, it is possible to prevent a voltage higher than a gate withstand voltage, or gate electrical strength, of the gate C2 of the horizontal transfer register 3 from being applied to the terminal T2 and prevent the insulation film 14 of the gate C2 of the horizontal transfer register 3 from being destroyed. FIG. 7 shows voltage-current characteristics of the snapback phenomenon.

When positive static electricity is applied to the terminal T2, namely, to the drain 13 of the protective MOS transistor H12, breakdown occurs between the drain 13 and the P-type well 6 (breakdown voltage VB). With the increase of the breakdown electric current (Ip2) between the drain 13 and the P-type well 6, the electric potential of the P-type well 6 rises (or becomes deep), and the protective MOS transistor H12 is turned on (snapback voltage VS). As a result, a large amount of current Ip1 flows between the drain 13 and the source 11, and the drain. voltage drops, i.e., the voltage of the terminal T2 drops.

When static electricity that is negative with respect to the ground terminal G1 is applied to the terminal T2, junction between the drain 13 of the protective MOS transistor H12 and the P-type well 6 is biased forward, and the negative static electricity is discharged (Im1) from the terminal T2 to the ground terminal G1. Thus, it is possible to prevent the insulation film 14 of the gate C2 of the horizontal transfer register 3 from being destroyed.

On the other hand, when static electricity that is positive with respect to the ground terminal G1 is applied to the terminal T1 for some reason, breakdown occurs between the drain 10 of the protective MOS transistor H11 and the P-type well 7, the electric potential of the P-type well 7 rises (or becomes deep), and the positive static electricity is discharged (Ip3) to the N-type substrate 15. Thus, it is possible to prevent the insulation film 16 of the gate C1 of the vertical transfer register 2 from being destroyed.

When static electricity that is negative with respect to the ground terminal G1 is applied to the terminal T1, junction between the drain 10 of the protective MOS transistor H11 and the P-type well 7 is biased forward, and the electric potential of the P-type well 7 drops (or becomes shallow). As a result, breakdown occurs between the P-type well 7 and the N-type substrate 15. Thus, the negative static electricity is discharged (Im2) from the terminal T1 to the ground terminal G1 through the N-type substrate 15. Thus, the insulation film 16 of the gate C1 of the vertical transfer register 2 is prevented from being destroyed.

Furthermore, when static electricity that is positive with respect to the terminal T1 is applied to the terminal T2, breakdown occurs between the drain 13 of the protective MOS transistor H12 and the P-type well 6, and the positive static electricity is discharged (Ip4) to the N-type substrate 15. Thus, the insulation film 17 positioned between the gate C1 of the vertical transfer register 2 and the gate C2 of the horizontal transfer register 3 is prevented from being destroyed.

When static electricity that is negative with respect to the terminal T1 is applied to the terminal T2, there occurs forward bias between the drain 13 of the protective MOS transistor H12 and the P-type well 6, and the electric potential of the P-type well 6 drops (or becomes shallow). As a result, breakdown occurs between the P-type well 6 and the N-type substrate 15. Thus, the negative static electricity is discharged (Im3) from the terminal T2 to the terminal T1 through the N-type substrate 15. Thus, it is possible to prevent the destruction of the insulation film 17 positioned between the gate C1 of the vertical transfer register 2 and the gate C2 of the horizontal transfer register 3.

When the static electricity is applied to the terminal T1 with respect to the terminal T2, an operation similar to the above is performed.

Japanese Patent Laid-Open Publication No. 8-116027 also discloses protective circuits for each terminal. The protective circuits are constructed of bipolar transistors wherein emitters are connected with corresponding terminals, bases are commonly connected, and collectors are connected with an N-type substrate.

Meanwhile, because the vertical transfer register of the CCD solid-state image sensing device needs to be driven with a negative voltage, protective circuits therefor should be formed on the P-type well to which a negative voltage is applied. On the other hand, to transfer an electric charge, the gates of the vertical transfer register are positioned above the P-type well to which the ground voltage is applied, similar to the image-sensing part 5. In the construction of the conventional protective circuit shown in FIGS. 6A and 6B, when static electricity is applied to the terminal T1 of the vertical transfer register 2 with respect to the ground terminal G1, the static electricity is discharged to a path leading to the N-type substrate 15 or to a path passing through the N-type substrate 15. They are the only discharge paths. The N-type substrate 15 has a comparatively high resistance (R1, R2). Thus, the time constant in discharge is comparatively great and a voltage higher than the gate electrical strength is easily applied to the gate C1 of the vertical transfer register 2, which causes destruction of the insulation film 16. That is, disadvantageously, electrostatic strength, or resistance to static electricity, is low. When the static electricity is applied between the terminals T1 and T2, the static electricity is discharged via a path leading to the N-type substrate 15 or a path through the N-type substrate 15. Thus, a disadvantage similar to the above also occurs in this case.

In the construction disclosed in Japanese Laid-Open Patent Publication No. 8-116027, all discharge paths of static electricity pass the N-type substrate. Thus, this construction has a disadvantage similar to the above.

Meanwhile, because a greatest operating voltage is applied to the terminals of the vertical transfer register, especially, terminals $\phi V1$ and $\phi V3$, an operating voltage of the protective circuit connected with each terminal is set to a voltage higher than that of the terminals $\phi V1$ and $\phi V3$. In the prior art, an operating voltage same as that for the protective circuit connected with the terminal $\phi V1$, $\phi V3$ is used also for the protective circuits connected with the terminals $\phi V2$ and $\phi V4$ of the vertical transfer register 2 and the terminals $\phi H1$ and $\phi H2$ of the horizontal transfer register 3 to which comparatively low operating voltages are applied. That is, although the operating voltage for such a terminal is low, the operating voltage of the protective circuit connected therewith is set high. Thus, the margin between the operating voltage of the protective circuit and a voltage destroying the gate insulation film is small, and hence, the electrostatic strength is low.

SUMMARY OF THE INVENTION

It is an object of the present invention to provide a semiconductor device having an improved protective function and capable of solving the above problems.

The present invention provides a semiconductor device wherein protection circuits for protecting an interior of the semiconductor device are connected to a plurality of terminals through which various voltages are applied to the semiconductor device, the terminals including at least a first terminal, wherein the protection circuits include:

a first circuit connected between the first terminal and a negative potential line for supplying a negative potential; and a second circuit connected between the first terminal and a ground potential line for supplying a ground potential.

In the semiconductor device, when static electricity which is positive or negative with respect to the ground voltage is applied to the first terminal, the second circuit connected between the first terminal and the ground potential line serves to form a discharge path that does not pass a semiconductor substrate. Therefore, even when the first terminal is a terminal required to be operated by a negative voltage, it is possible to prevent the interior of an element connected with the first terminal from being destroyed by static electricity applied to the first terminal.

In one embodiment, the protection circuits further include a third circuit connected between the ground potential line and a second terminal.

In this case, thanks to the third circuit that is connected between the second terminal and the ground potential line, static electricity applied to the second terminal is discharged at a comparatively low resistance through a discharge pass not including the semiconductor substrate.

Further, even in the case where static electricity is applied between the first and second terminals, the static electricity is discharged at a comparatively low resistance not through the semiconductor substrate having a high resistance, but through the second circuit connected between the first terminal and the ground potential line and through the third circuit connected between the second terminal and the ground potential line. Thus, it is possible to avoid destruction of the interior of elements connected between those terminals.

The first circuit may be constructed of one of a MOS transistor, a bipolar transistor and a diode, and the second and third circuits each may be constructed of a MOS transistor or a bipolar transistor.

In one embodiment, the first circuit is constituted of a first MOS transistor having a drain connected with the first terminal, a source connected with the negative potential line, and a gate connected with either the first terminal or the negative potential line. The second circuit is constituted of a second MOS transistor having a drain connected with the first terminal, a source connected with the ground potential line, and a gate connected with either the first terminal or the ground potential line. The third circuit is constituted of a third MOS transistor having a drain connected with the second terminal, a source connected with the ground potential line, and a gate connected with either the second terminal or the ground potential line.

In another embodiment, the first circuit is constituted of a first bipolar transistor having an emitter connected with the first terminal, and a base and a collector each connected with the negative potential line. The second circuit is constituted of a second bipolar transistor having an emitter connected with the first terminal, a base connected with the negative potential line, and a collector connected with the ground potential line. Also, the third circuit is constituted of a third bipolar transistor having an emitter connected with the second terminal, and a base and a collector each connected with the ground potential line.

In the above two embodiments, each of the first MOS transistor and the first bipolar transistor can be replaced with a diode that is provided between the first terminal and the negative potential line.

By varying operating voltage of the protective circuits in accordance with operating voltages for the terminals with which the protective circuits are connected, it is possible to prevent the destruction of the interior of elements connected with the terminals to further extent.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 5 schematically shows entirety of a common solid-state image sensing device;

FIG. 7 shows snapback characteristic of a protective circuit.

DETAILED DESCRIPTION OF THE PREFERRED EMBODIMENTS (First Embodiment)

Figure 1A:
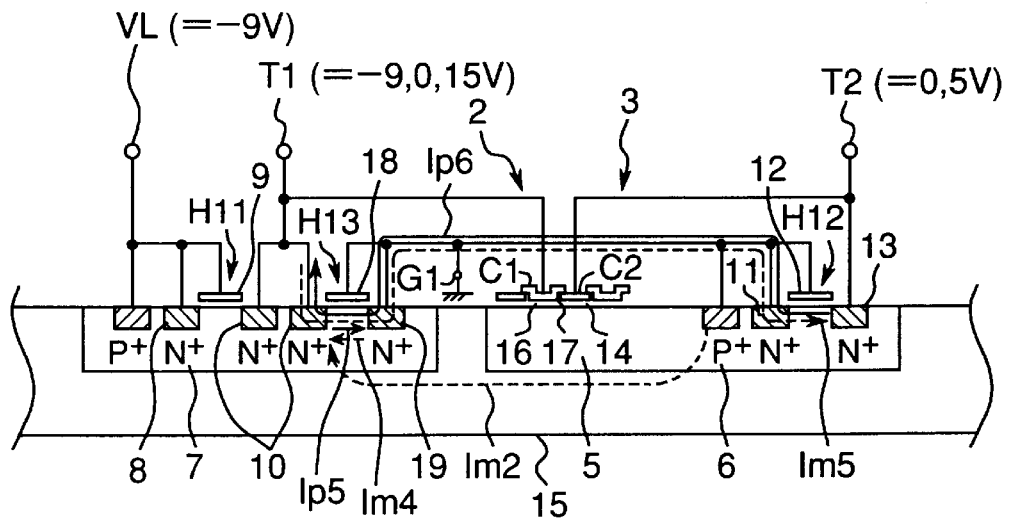
FIGS. 1A and 1B are a schematic sectional view showing a first embodiment of the semiconductor device of the present invention and a circuit diagram showing an equivalent circuit thereof, respectively.
Figure 1B:
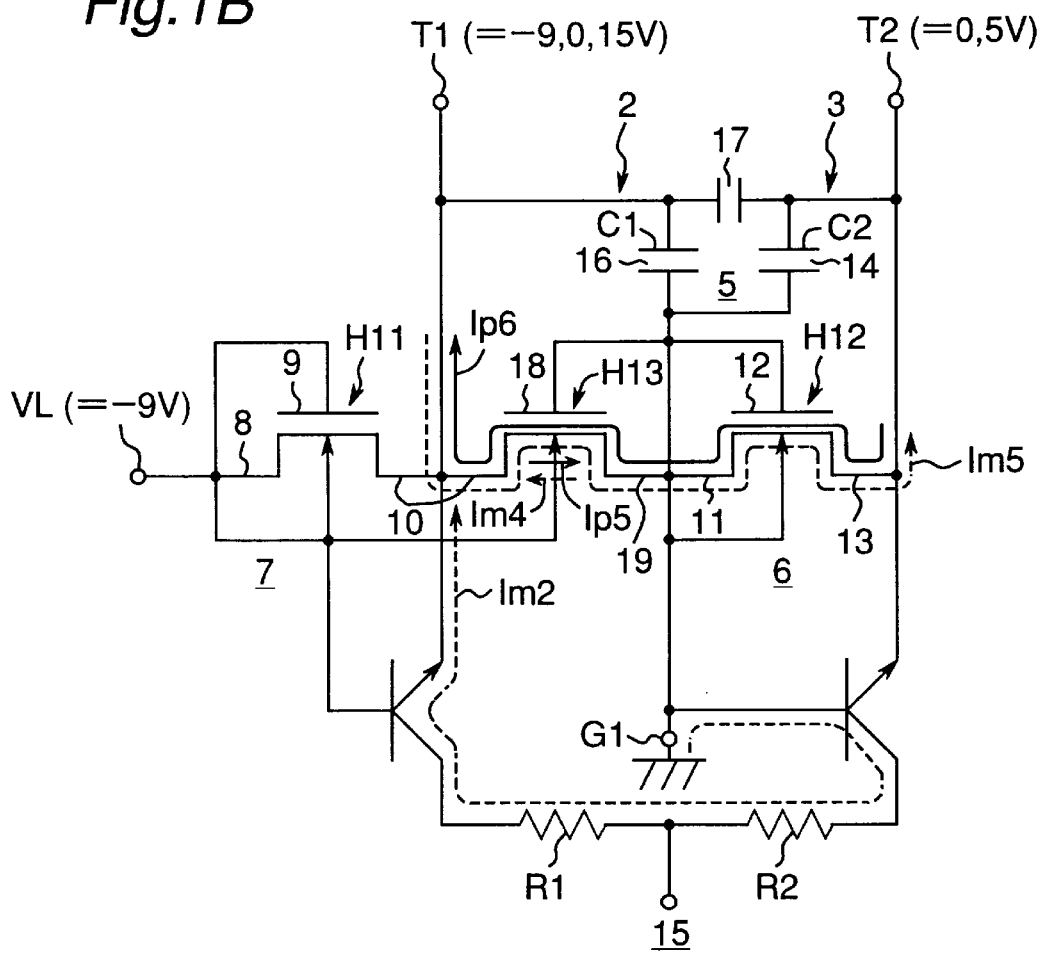
Figure 6A:
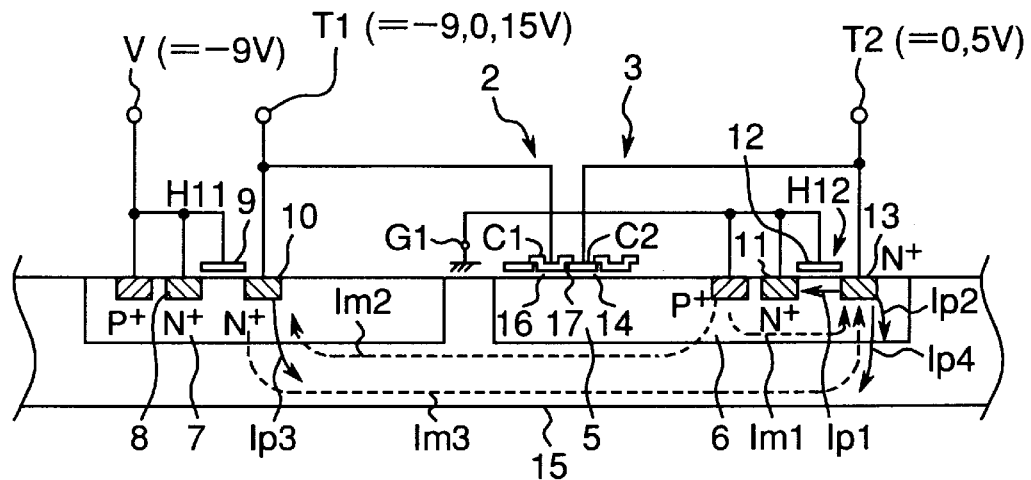
FIGS. 6A and 6B are a schematic sectional view showing a conventional CCD solid-state image sensing device and a circuit diagram showing an equivalent circuit thereof, respectively.
Figure 6B:
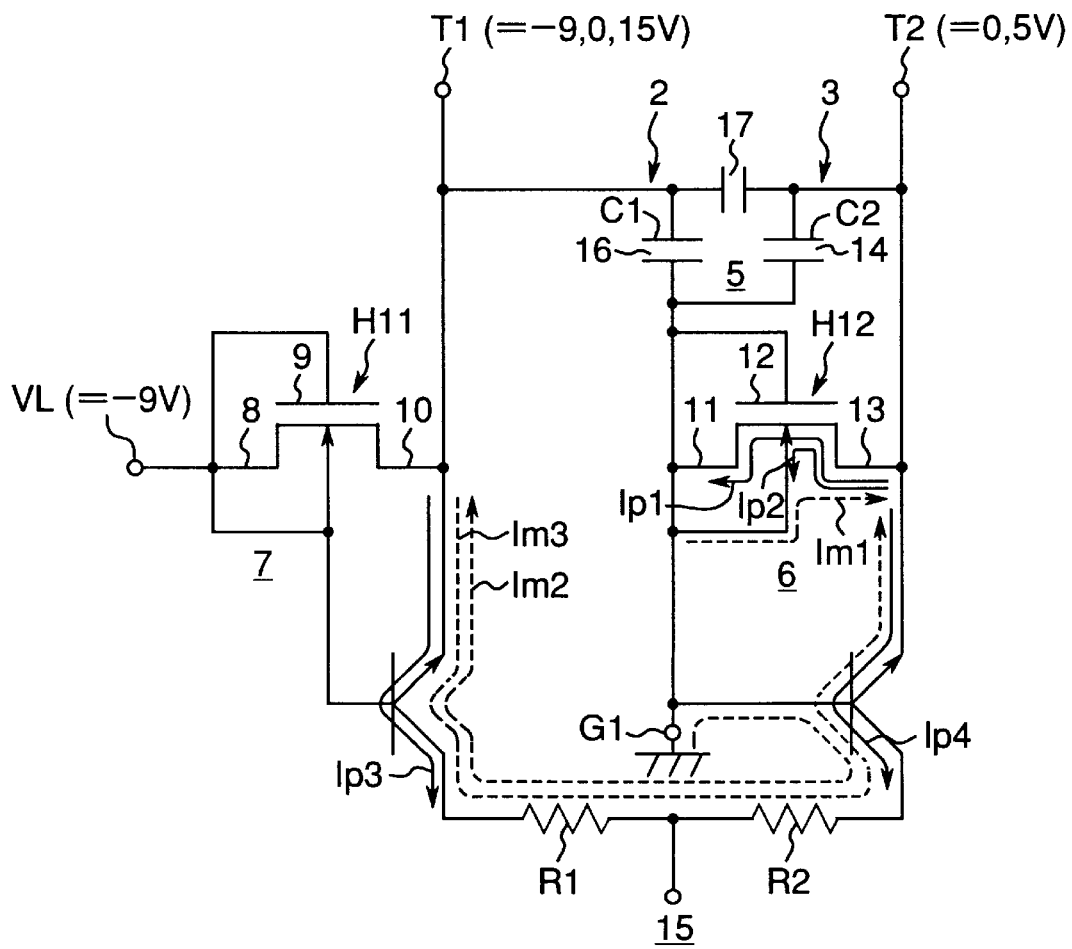

FIGS. 1A and 1B respectively show a schematic sectional view and an equivalent circuit diagram of the semiconductor device of a first embodiment of the present invention. In FIGS. 1A and 1B, same parts as those shown in FIGS. 6A and 6B are denoted by the same reference numerals and symbols. In the semiconductor device of the first embodiment, the following construction is added to the conventional construction. That is, a protective MOS transistor serving as a protective circuit is provided between the terminal T1 and a ground potential line. The first embodiment will be described below with reference to FIGS. 1A and 1B.

In addition to the protective MOS transistor H11, a protective MOS transistor H13 is also provided on the P-type well 7 having a negative voltage VL so that the MOS transistors H11 and H13 are connected with the terminal T1 of the vertical transfer register that needs to be driven by a negative voltage. The protective MOS transistor H13 is constructed of a drain 10 and a source 19 formed in the P-type well 7, and a gate 18 formed over a channel provided between the drain 10 and the source 19 with a gate insulation film interposed between the channel and the gate 18. In the protective MOS transistor H13, the gate 18 and the source 19 are connected with the ground terminal G1, and the drain 10 is connected with the terminal T1.

With the above arrangement, when static electricity that is positive with respect to the ground terminal G1 is applied to the terminal T1 for some reason, owing to snapback phenomenon of the protective MOS transistor H13, the positive static electricity is discharged (Ip5) from the terminal T1 to the ground terminal G1 through the protective MOS transistor H13 at a comparatively low resistance, and not through the N-type substrate 15 of a high resistance. Therefore, it is possible to prevent a voltage higher than a gate withstand voltage, or electrical strength, of the gate C1 of the vertical transfer register from being applied to the terminal T1, and thus, avoid the destruction of the insulation film 16 of the gate C1.

When static electricity that is negative with respect to the ground terminal G1 is applied to the terminal T1, there occurs forward bias between the drain 10 of the protective MOS transistor H13 and the P-type well 7. Consequently, the negative static electricity is partially discharged (Im2) from the terminal T1 to the ground terminal G1 through the N-type substrate 15. The negative static electricity is also discharged (Im4) to the ground terminal G1 from the terminal T1 through the protective MOS transistor H13, and not through the N-type substrate 15 of a high resistance, owing to the snapback phenomenon of the protective MOS transistor H13. Therefore, it is possible to prevent a voltage higher than the gate electrical strength of the gate C1 of the vertical transfer register from being applied to the terminal T1, and thus avoid the destruction of the insulation film 16 of the gate C1 of the vertical transfer register.

When static electricity that is positive (negative) with respect to the terminal T1 is applied to the terminal T2, the electric potential of the ground terminal G1 rises (drops) owing to the snapback phenomenon (ON operation) of the protective MOS transistor H12. That is, the electric potentials of the gate 18 and the source 19 of the protective MOS transistor H13 rise (drop), and the protective MOS transistor H13 is brought into an ON state (a snapback phenomenon). Thus, the static electricity is discharged from the terminal T2 to the terminal T1 as electric current Ip6 (Im5) through the protective MOS transistor H13 (not through the N-type substrate 15 of a high resistance), and through the protective MOS transistor H12. At this time, the electric current Ip6 flows owing to the snapback phenomenon of the H12 and the ON operation of the protective MOS transistor H13, and the electric current Im5 flows owing to the ON operation of the protective MOS transistor H12 and the snapback phenomenon of the protective MOS transistor H13. Therefore, the insulation film 17 positioned between the gate C1 of the vertical transfer register and the gate C2 of the horizontal transfer register is prevented from being destroyed.

When static electricity that is positive (negative) with respect to the terminal T2 is applied to the terminal T1, it is also possible to prevent the destruction of the insulation film 17 positioned between the gates C1 and C2 of the vertical and horizontal registers by a similar operation.

(Second Embodiment)

Figure 2A:
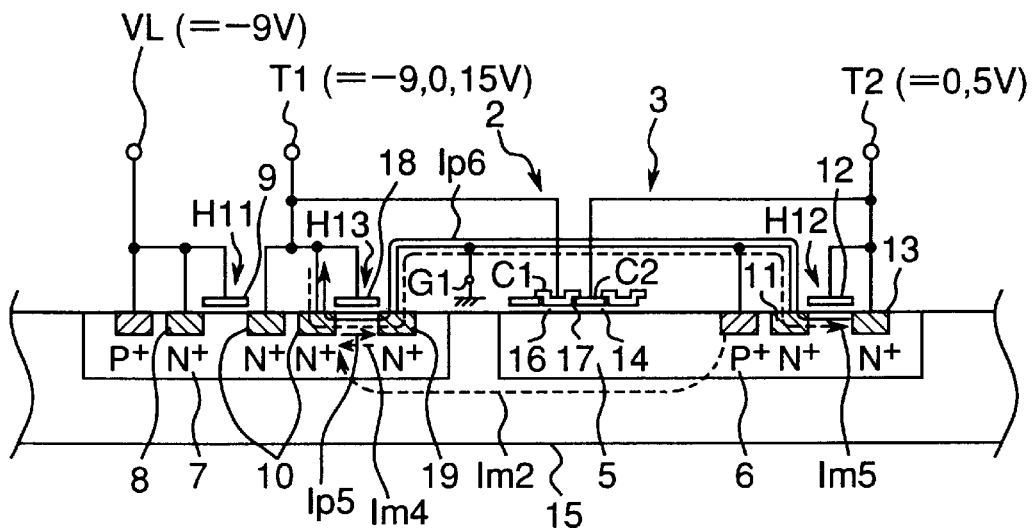
FIGS. 2A and 2B are a schematic sectional view showing a second embodiment of the semiconductor device of the present invention and a circuit diagram showing an equivalent circuit thereof, respectively.
Figure 2B:
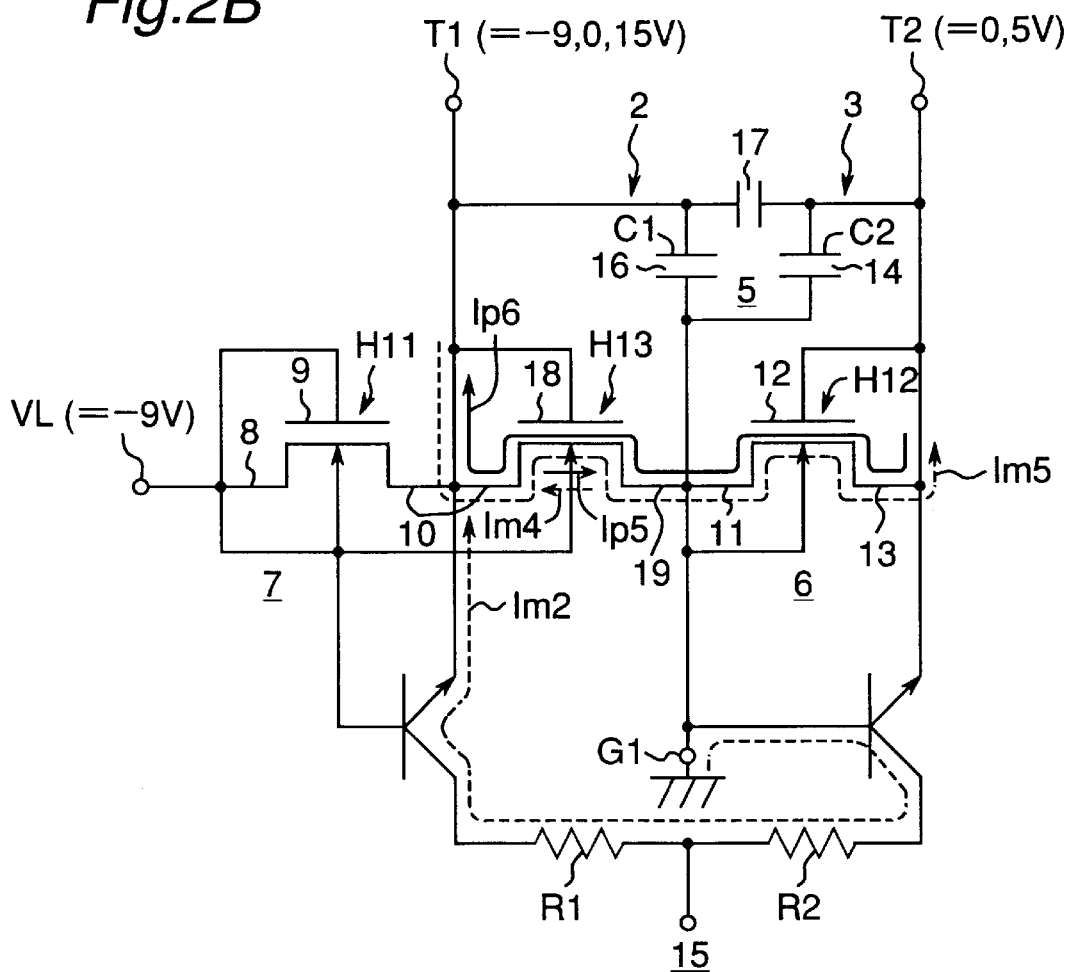

FIGS. 2A and 2B respectively show a schematic sectional view and an equivalent circuit diagram of the semiconductor device of a second embodiment of the present invention. The second embodiment is a modification of the first embodiment and different from the first embodiment in that the gates of the protective MOS transistors H12 and H13 are connected with the sources in the first embodiment, while the gates of the protective MOS transistors H12 and H13 are connected with terminals in the second embodiment. More specifically, the protective circuits in the second embodiment are used for terminals to which comparatively low operational voltages are applied. In this embodiment, the terminal T1 is supplied with binary pulses of −9 V and 0 V as the operating voltage (in this case, the terminal T1 corresponds to the terminal φV2, φV4 in FIG. 5), and the terminal T2 is supplied with binary pulses of 0 V and 5 V as the operating voltage.

In this construction, when, with respect to the ground terminal G1, positive static electricity is applied to the terminal T1 for some reason, a positive voltage is applied to the gate of the protective MOS transistor H13, the protective MOS transistor H13 is turned on at a lower voltage than in the first embodiment, and the positive static electricity is discharged (Ip5) from the terminal T1 to the ground terminal G1 at a comparatively low resistance through the protective MOS transistor H13 (not through the N-type substrate 15 of a high resistance). Therefore, it is possible to prevent a voltage higher than the electric strength of the gate C1 of the vertical transfer register from being applied to the terminal T1 and thus, avoid the destruction of the insulation film 16 of the gate C1 of the vertical transfer register. In this embodiment, because the operating voltage for the protective MOS transistor H13 (voltage to turn it on) can be set lower than in the first embodiment, it is possible to take a greater margin between the electrical strength of the gate C1 of the vertical transfer register and the operating voltage of the protective MOS transistor H13. Therefore, it is possible to improve the electrostatic strength to a higher extent.

On the other hand, when static electricity that is negative with respect to the ground terminal G1 is applied to the terminal T1, junction between the drain 10 of the protective MOS transistor H13 and the P-type well 7 is biased forward. Consequently, the negative static electricity is discharged (Im2) from the terminal T1 to the ground terminal G1 through the N-type substrate 15. In addition, owing to the snapback phenomenon of the protective MOS transistor H13, the negative static electricity is also discharged (Im4) from the terminal T1 to the ground terminal G1 through the protective MOS transistor H13 (not through the N-type substrate 15 of a high resistance). Therefore, it is possible to prevent a voltage higher than the electrical strength of the gate C1 of the vertical transfer register from being applied to the terminal T1 and thus, prevent the insulation film 16 of the gate C1 of the vertical transfer register from being destroyed.

When static electricity that is positive (negative) with respect to the terminal T1 is applied to the terminal T2, an ON operation (snapback phenomenon) of the protective MOS transistor H12 causes the electric potential of the ground terminal G1 to rise (drop). That is, the electric potential of the source 19 of the protective MOS transistor H13 rises (drops), and owing to the snapback phenomenon (an ON state) of the protective MOS transistor H13, the static electricity is discharged from the terminal T2 to the terminal T1 as electric current Ip6 (Im5) through the protective MOS transistor H13 (and not through the N-type substrate 15 of a high resistance). At this time, the electric current Ip6 flows owing to the ON operation of the protective MOS transistor H12 and the snapback phenomenon of the protective MOS transistor H13, and the electric current Im5 flows owing to the snapback phenomenon of the protective MOS transistor H12 and the ON operation of the protective MOS transistor H13. This prevents the insulation film 17 positioned between the gate C1 of the vertical transfer register and the gate C2 of the horizontal transfer register from being destroyed.

Similarly, when static electricity is applied toward the terminal T2 through the terminal T1, it is possible to prevent the destruction of the insulation film 17 positioned between the gate C1 of the vertical transfer register and the gate C2 of the horizontal transfer register by a similar operation.

Furthermore, when static electricity that is positive with respect to the ground terminal G1 is applied to the terminal T2 for some reason, similarly to the case in which static electricity that is positive with respect to the ground terminal G1 is applied to the terminal T1, a positive voltage is applied across the gate of the protective MOS transistor H12, the protective MOS transistor H12 is turned on at a voltage lower than in the first embodiment, and the positive static electricity is discharged at comparatively low resistance from the terminal T2 to the ground terminal G1 through the protective MOS transistor H12. Because the operating voltage of the protective MOS transistor H12 (voltage to turn it on) can be set lower than in the prior art and the first embodiment, it is possible to increase a margin between the electrical strength of the gate C2 of the horizontal transfer register and the operating voltage of the protective MOS transistor H12. Thus, it is possible to improve the electrostatic strength of the terminal to a higher extent.

As described above, according to the second embodiment, owing to the arrangement in which the gate of each of the protective MOS transistors H12 and H13 is connected with its associated terminal, it is possible to set the operating voltage of each of the protective MOS transistors H12 and H13 to a lower value than in the case that the gate of each of the protective MOS transistors H12 and H13 is connected with the source thereof. By using the protective circuits of this embodiment for the terminals having comparatively low operating voltages that do not exceed the operating voltages of the protective MOS transistors H12 and H13, namely, by applying the protective circuits to the terminals φV2 and φV4 (from among the terminals T1) to which binary pulses of operating voltages −9 V and 0 V are applied and to the terminal T2 to which binary pulses of operating voltages 0 V and 5 V are applied, it is possible to take a wide margin between the operating voltage of the protective circuit and the voltage destroying the gate insulation film. Thus, it is possible to improve the electrostatic strength to a higher extent.

(Third Embodiment)

Figure 3A:
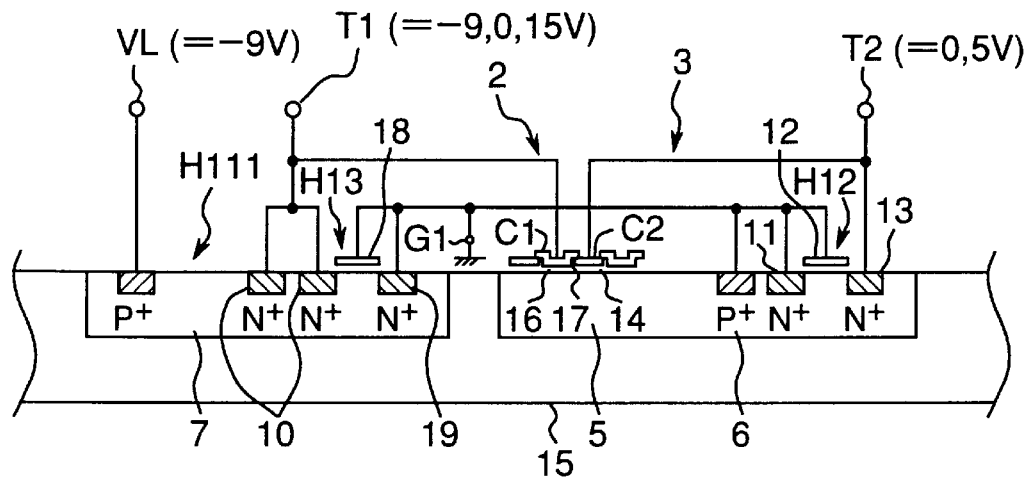
FIGS. 3A and 3B are a schematic sectional view showing a third embodiment of the semiconductor device of the present invention and a circuit diagram showing an equivalent circuit thereof, respectively.
Figure 3B:
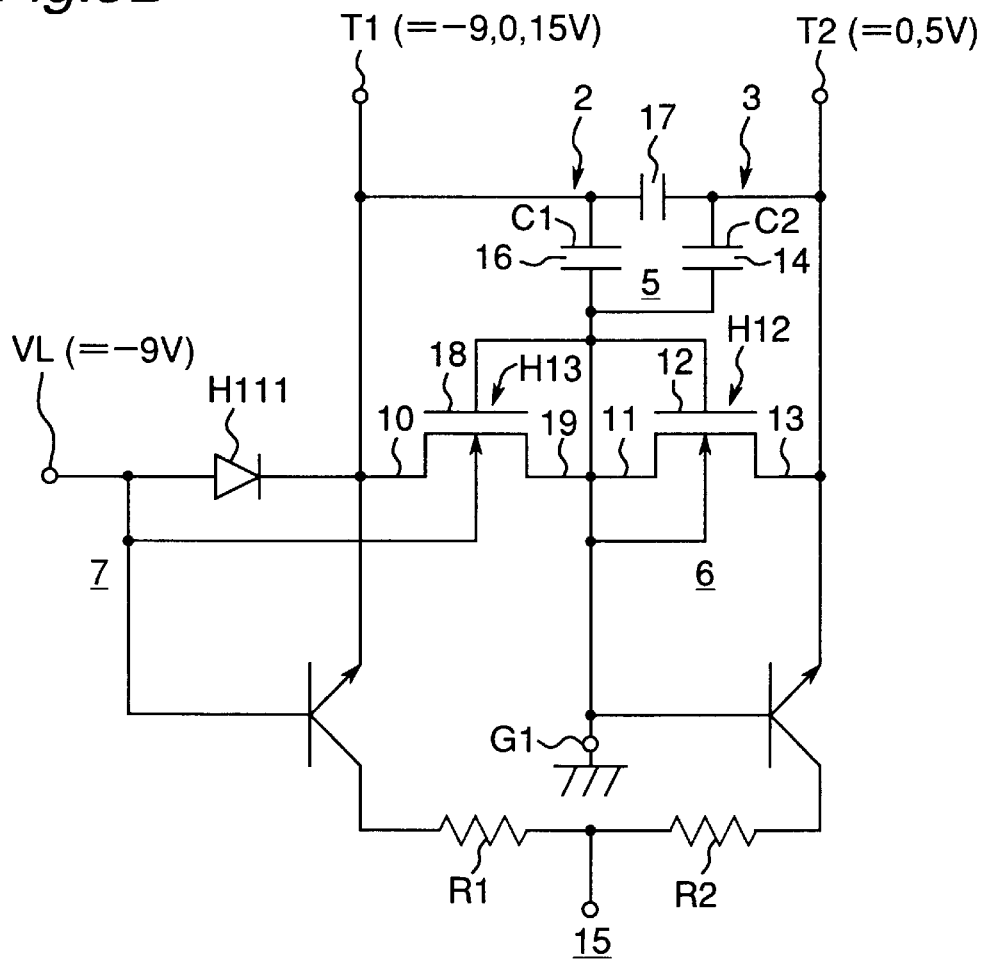

FIGS. 3A and 3B show a schematic sectional view and an equivalent circuit diagram of the semiconductor device of a third embodiment of the present invention, respectively. The third embodiment is a modification of the first embodiment wherein the protective MOS transistor H11 serving as a protective circuit is replaced with a diode H111. In FIGS. 3A and 3B, parts same as those of the first embodiment shown in FIGS. 1A and 1B are denoted by the same reference numerals and symbols. The operation of the protective circuit described above in connection with the first embodiment is not affected by the substitution of the diode H111 for the MOS transistor H11.

(Fourth Embodiment)

Figure 4A:
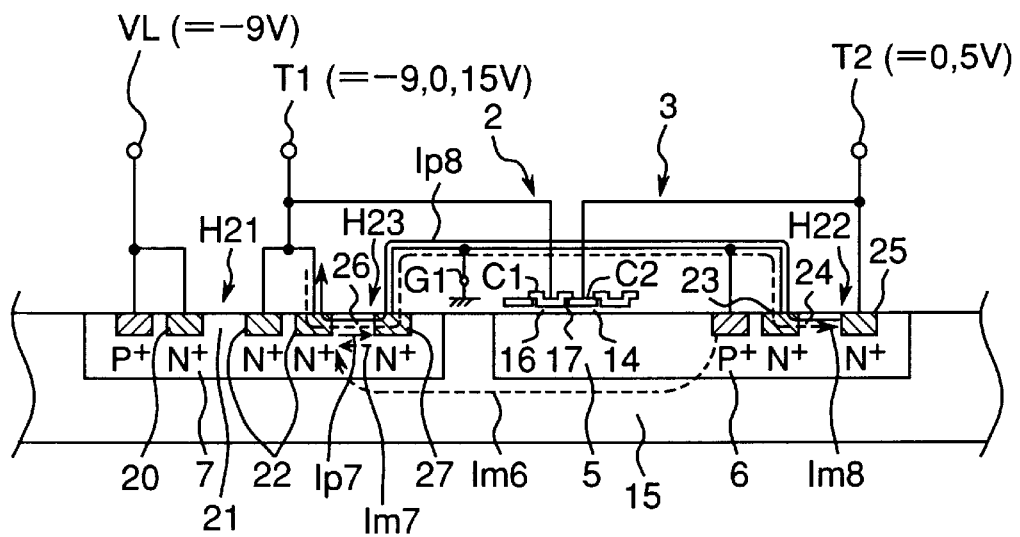
FIGS. 4A and 4B are a schematic sectional view showing a fourth embodiment of the semiconductor device of the present invention and a circuit diagram showing an equivalent circuit thereof, respectively.
Figure 4B:
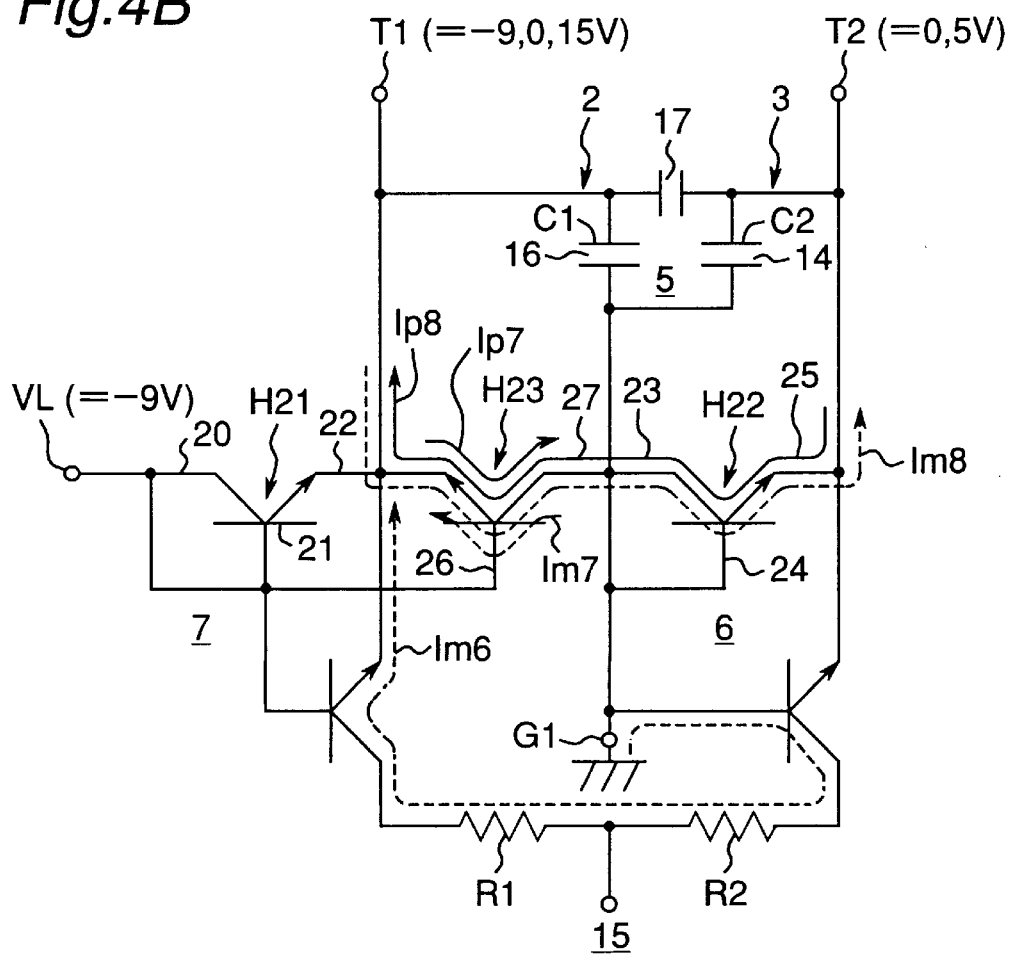

FIGS. 4A and 4B show a schematic sectional view and an equivalent circuit diagram of the semiconductor device of a fourth embodiment of the present invention, respectively. The semiconductor device of the fourth embodiment includes protective bipolar transistors H21 and H22 instead of the protective MOS transistors H11 and H12, and also includes a protective bipolar transistor H23 instead of the protective MOS transistors H13. In FIGS. 4A and 4B, parts same as those of the first embodiment shown in FIGS. 1A and 1B are denoted by the same reference numerals and symbols.

The protective bipolar transistor H21 is constructed of a collector 20, a base 21, and an emitter 22. The protective bipolar transistor H23 is constructed of a collector 27, a base 26, and the emitter 22. Both the protective bipolar transistors H21 and the H23 are formed on the P-type well 7. The protective bipolar transistor H22 is constructed of a collector 23, a base 24, and an emitter 25 and formed on the P-type well 6. The protective bipolar transistors H21 and H22 are connected with the terminals T1 and T2, respectively, to protect the gates C1 and C2. Because the terminal T1 is driven at a negative voltage, the protective bipolar transistor H21 is formed on the P-type well 7 of a negative voltage (VL=−9 V). The collector 20 and the base 21 of the protective bipolar transistor H21 are connected with the negative voltage terminal VL, and the emitter 22 thereof is connected with the terminal T1. On the other hand, because the terminal T2 is driven at a positive voltage, the protective bipolar transistor H22 is formed on the P-type well 6 having the ground voltage, similarly to the image-sensing part 5. The collector 23 and the base 24 of the bipolar transistor H22 are connected with the ground, and the emitter 25 thereof is connected with the terminal T2.

In addition to the protective bipolar transistor H21, the protective bipolar transistor H23 is also provided on the P-type well 7 having a negative voltage VL so that the bipolar transistors H21 and H23 are connected with the terminal T1 of the vertical transfer register that needs to be driven at a negative voltage. In the protective bipolar transistor H23, the base 26 is connected with the negative voltage terminal VL, the collector 27 is connected with the ground terminal G1, and the emitter 22 is connected with the terminal T1.

With the above arrangement, when static electricity that is positive with respect to the ground terminal G1 is applied to the terminal T1 for some reason, the positive static electricity is discharged (Ip7) to the ground terminal G1 from the terminal T1 through the protective bipolar transistor H23 (not through the N-type substrate 15 of a high resistance), due to the snapback phenomenon in the protective bipolar transistor H23. Therefore, it is possible to prevent a voltage higher than the electrical strength of the gate C1 of the vertical transfer register from being applied to the terminal T1 and thus to avoid the destruction of the insulation film 16 of the gate C1.

When static electricity that is negative with respect to the ground terminal G1 is applied to the terminal T1, junction between the emitter 22 and the base 26 of the protective bipolar transistor H23 is forward biased, and the negative static electricity is discharged (Im6) from the terminal T1 to the ground terminal G1 through the N-type substrate 15. At this time, owing to the snapback phenomenon in the protective bipolar transistor H23, the negative static electricity is also discharged (Im7) from the terminal T1 to the ground terminal G1 through the protective bipolar transistor H23 (not through the N-type substrate 15 of a high resistance). Therefore, it is possible to prevent a voltage higher than the electrical strength of the gate C1 of the vertical transfer register from being applied to the terminal T1 and thus, prevent the destruction of the insulation film 16 of the gate C1.

When static electricity that is positive (negative) with respect to the terminal T1 is applied to the terminal T2, the electric potential of the ground terminal G1 rises (drops) owing to the snapback phenomenon of the protective bipolar transistor H22. More specifically, when the electric potential of the collector 27 of the protective bipolar transistor H23 rises (drops) such that the potential difference between the collector 27 and the base 26 becomes higher than the breakdown voltage therebetween, the snapback phenomenon takes place in the protective bipolar transistor H23 also. Thus, the static electricity is discharged from the terminal T2 to the terminal T1 as electric current Ip8 (Im8) through the protective bipolar transistor H23 (not through the N-type substrate 15 of a high resistance) as well as through the protective bipolar transistor H22. Therefore, it is possible to prevent the insulation film 17 positioned between the gate C1 of the vertical transfer register and the gate C2 of the horizontal transfer register from being destroyed.

Also, when static electricity that is positive (negative) with respect to the terminal T2 is applied to the terminal T1, it is possible to avoid the destruction of the insulation film 17 positioned between the gate C1 of the vertical transfer register and the gate C2 of the horizontal transfer register by a similar operation.

In the above embodiments, a protective circuit is connected between a terminal driven by a voltage ranging from a negative voltage to a positive voltage and a negative potential line supplying a negative voltage, and between the terminal and a ground potential line supplying the ground voltage. As a result, a discharge path not passing an N-type substrate having a high resistance is formed. Therefore, when static electricity is applied to the terminal, the static electricity can be discharged at a comparatively low resistance via the path. Thus, it is possible to improve the electrostatic strength of the terminal. For example, in an ESD (Electro-Static Discharge) test of a Military Specification (MIL), it has been confirmed that the construction of the protective circuit according to the present invention increases the electrostatic strength by about 1500 V, as compared with the construction of the conventional protective circuit. Furthermore, it is possible to improve the electrostatic strength of the terminal to a higher extent because the protective circuit connected to the terminal is made to have an operating voltage in accordance with the operating voltage of the terminal.

The protective circuits in the embodiments consist of the MOS transistors or the bipolar transistors. Alternatively, they consist of field transistors each having a field oxide film used as the gate insulation film, and source and drain regions isolated from each other by the field oxide film.

In the embodiments described above, the present invention is applied to the CCD solid-state image sensing device. But, the present invention is also applicable to other charge-coupled devices. Also, the present invention is applicable to a semiconductor device using a plurality of MOS transistors to which different electric potentials are applied.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device wherein protective circuits for protecting an interior of the semiconductor device are connected to a plurality of terminals through which various voltages are applied to the semiconductor device, said terminals including at least a first terminal, wherein said protective circuits include:

a first circuit connected between the first terminal and a negative potential line for supplying a negative potential, said first circuit being operative to cause charges at the first terminal to be discharged to ground via a first relatively high resistance discharge path; and a second circuit connected between the first terminal and a ground potential line for supplying a ground potential, said second circuit being operative to cause charges at the first terminal to be discharged to ground via a second relatively low resistance discharge path.

2. The semiconductor device according to claim 1, wherein said protective circuits further include a third circuit connected between said ground potential line and a second terminal.

3. The semiconductor device according to claim 2, wherein said first circuit comprises one of a MOS transistor, a bipolar transistor and a diode, and said second and third circuits each comprise a MOS transistor or a bipolar transistor.

4. The semiconductor device according to claim 3, wherein said first circuit comprises a first MOS transistor having a drain connected with the first terminal, a source connected with the negative potential line, and a gate connected with either the first terminal or the negative potential line, said second circuit comprises a second MOS transistor having a drain connected with the first terminal, a source connected with the ground potential line, and a gate connected with either the first terminal or the ground potential line, and said third circuit comprises a third MOS transistor having a drain connected with the second terminal, a source connected with the ground potential line, and a gate connected with either the second terminal or the ground potential line.

5. The semiconductor device according to claim 3, wherein said first circuit comprises a first bipolar transistor having an emitter connected with the first terminal, and a base and a collector each connected with the negative potential line, said second circuit comprises a second bipolar transistor having an emitter connected with the first terminal, a base connected with the negative potential line, and a collector connected with the ground potential line, and said third circuit comprises a third bipolar transistor having an emitter connected with the second terminal, and a base and a collector each connected with the ground potential line.

6. The semiconductor device according to claim 3, wherein said first circuit comprises a diode provided between the first terminal and the negative potential line, said second circuit comprises a MOS transistor having a drain connected with the first terminal, a source connected with the ground potential line, and a gate connected with either the first terminal or the ground potential line, and said third circuit comprises a MOS transistor having a drain connected with the second terminal, a source connected with the ground potential line, and a gate connected with either the second terminal or the ground potential line.

7. The semiconductor device according to claim 3, wherein said first circuit comprises a diode provided between the first terminal and the negative potential line, said second circuit comprises a bipolar transistor having an emitter connected with the first terminal, a base connected with the negative potential line, and a collector connected with the ground potential line, and said third circuit comprises a bipolar transistor having an emitter connected with the second terminal, and a base and a collector each connected with the ground potential line.

8. The semiconductor device according to claim 2, wherein operating voltages for said first, second and third circuits are varied according to operating voltages for said first and second terminals, respectively.

9. The semiconductor device according to claim 8, wherein each of said first, second and third circuits comprises a MOS transistor in which a gate is connected with either a drain or a source.

10. The semiconductor device according to claim 1, wherein the first relatively high resistance path comprises a semiconductor substrate on which said semiconductor device is formed, and the second relatively low resistance path does not comprise the substrate.

11. The semiconductor device according to claim 1, wherein said semiconductor device is an image sensing device.

12. A semiconductor device, comprising:

a circuit section formed on a semiconductor substrate and having a first terminal connected to a signal input line;

a first protection circuit connected to the signal input line, said first protection circuit being operative to cause charges on the signal input line to be discharged to ground via a first signal path that includes said semiconductor substrate; and a second protection circuit connected to the signal input line, said second protection circuit being operative to cause charges on the signal input line to be discharged to ground via a second signal path that does not include said semiconductor substrate.

13. The semiconductor device according to claim 12, wherein the second signal path is connected to a ground potential line, said circuit section has a second terminal connected to another signal input line, and said semiconductor device further comprises a third protection circuit that is operative to cause charges on the other signal input line to be discharged to ground.

14. The semiconductor device according to claim 13, wherein said first circuit comprises a first MOS transistor having a drain connected with the first terminal, a source connected with a negative potential line, and a gate connected with either the first terminal or the negative potential line, said second circuit comprises a second MOS transistor having a drain connected with the first terminal, a source connected with the ground potential line, and a gate connected with either the first terminal or the ground potential line, and said third circuit comprises a third MOS transistor having a drain connected with the second terminal, a source connected with the ground potential line, and a gate connected with either the second terminal or the ground potential line.

15. The semiconductor device according to claim 13, wherein said first circuit comprises a first bipolar transistor having an emitter connected with the first terminal, and a base and a collector each connected with a negative potential line, said second circuit comprises a second bipolar transistor having an emitter connected with the first terminal, a base connected with the negative potential line, and a collector connected with the ground potential line, and said third circuit comprises a third bipolar transistor having an emitter connected with the second terminal, and a base and a collector each connected with the ground potential line.

16. The semiconductor device according to claim 13, wherein said first circuit comprises a diode provided between the first terminal and a negative potential line, said second circuit comprises a MOS transistor having a drain connected with the first terminal, a source connected with the ground potential line, and a gate connected with either the first terminal or the ground potential line, and said third circuit comprises a MOS transistor having a drain connected with the second terminal, a source connected with the ground potential line, and a gate connected with either the second terminal or the ground potential line.

17. The semiconductor device according to claim 13, wherein said first circuit comprises a diode provided between the first terminal and a negative potential line, said second circuit comprises a bipolar transistor having an emitter connected with the first terminal, a base connected with the negative potential line, and a collector connected with a ground potential line, and said third circuit comprises a bipolar transistor having an emitter connected with the second terminal, and a base and a collector each connected with the ground potential line.

* * * * *